United States Patent [19]
Komiya et al.

[11] 4,376,795
[45] Mar. 15, 1983

[54] METHOD OF PRODUCING IMAGE SENSOR

[75] Inventors: Kazumi Komiya, Yokosuka; Toshio Yamashita, Katano; Masaru Ohno, Kashiwa, all of Japan

[73] Assignees: Nippon Telegraph & Telephone Public Corp.; Matsushita Electric Industrial Co., Ltd., both of Tokyo; Matsushita Graphic Communication Systems, Inc., Osaka, all of Japan

[21] Appl. No.: 300,105

[22] Filed: Sep. 8, 1981

[30] Foreign Application Priority Data

Sep. 9, 1980 [JP] Japan .................................. 55-123992

[51] Int. Cl.³ .......................... B05D 1/02; B05D 3/04; B05D 1/36; B05D 5/12

[52] U.S. Cl. ......................................... 427/75; 427/76
[58] Field of Search .................................... 427/75, 76

[56] References Cited

U.S. PATENT DOCUMENTS 3,148,084 9/1964 Hill et al. .............................. 427/64

*Primary Examiner*—James R. Hoffman
*Attorney, Agent, or Firm*—Stevens, Davis, Miller & Mosher

[57] ABSTRACT

An image sensor having a photoconductor array comprising tightly adherent CdS-CdSe or CdS-CdTe photoconductive solid solution thin film and having fast photoresponse speed and excellent spectral sensitivity characteristics.

2 Claims, 7 Drawing Figures

FIG. I(A)
FIG. I(B)
FIG. I(C)
FIG. I(D)
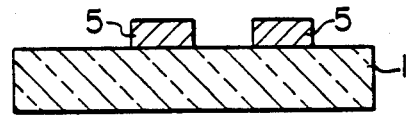
FIG. I(E)
FIG. 2
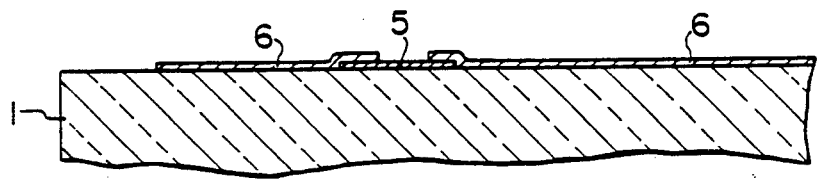
FIG. 3
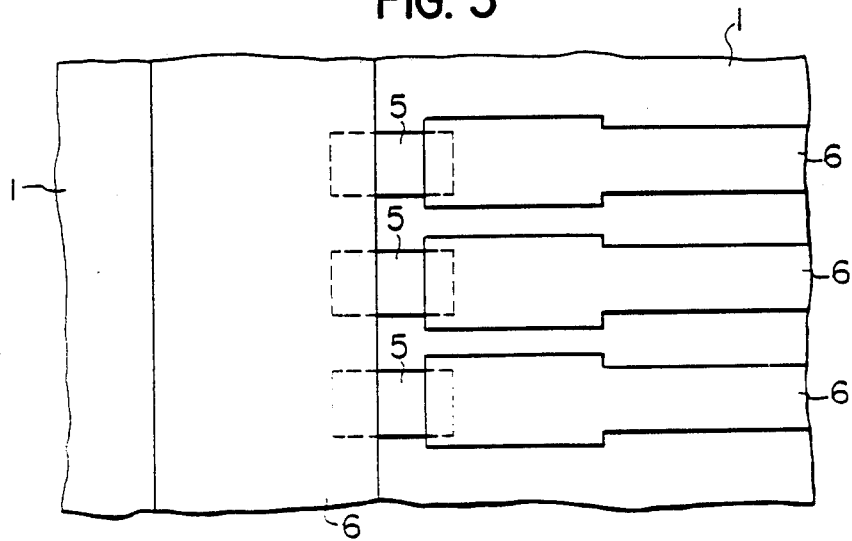

METHOD OF PRODUCING IMAGE SENSOR

This invention relates to an image sensor having a photoconductive solid solution film formed from a CdS photoconductive material and a CdSe or CdTe photoconductive material and having fast photoresponse speed and excellent spectral sensitivity characteristics.

The conventional image sensors using a CdS photoconductive film alone had the problem that, in application to a reading device such as facsimile, they could only be adapted to a low-speed unit due to (1) extremely low spectral sensitivity in the wavelength range over 500 nm and (2) low photoresponse speed, or around 30 msec under illumination of 100 1×. For improving the performance of such conventional image sensors using a CdS photoconductive film, it is generally practiced to mix a sensitizer such as CdSe or CdTe in CdS to use them as mixed crystal. This mixed crystal film formation is usually accomplished by first mixing CdS powder and CdSe or CdTe powder and then evaporating them simultaneously on a glass substrate in vacuo or by depositing the mixture by sputtering. This method, however, had the following drawbacks:

(1) Due to weak adhesion between said mixed crystal of CdS and CdSe or CdTe and the glass, the mixed crystal film might peel off when, for example, an array of small photoconductor elements are formed by photoetching.

(2) The CdS and CdSe or CdTe mixing ratio is hard to control, resulting in a wide scatter of photosensitivity and poor reproducibility.

Therefore, great difficulties would be encounterd when, for example, using said mixed crystal film of CdS and CdSe or CdTe for high-density arrangement of minute sensors such as image sensors for facsimile.

The present inventors have pursued further studies with a view to eliminating these disadvantages of the conventional CdS type thin-film photoconductors and consequently succeeded in completing the present invention.

The object of this invention is to provide a method of producing an image sensor having a photoconductor film with excellent adhesiveness to the insulating substrate and high sensitivity.

The method of this invention features a process which comprises forming a CdS film on an insulating substrate by chemical deposition or chemical spray, laminating a CdSe or CdTe film on said CdS film, subjecting said two layers to a heat treatment to form a solid solution thereof in an atmosphere containing vapor of one or more of the halides of Cd which is a common flux for said layers at a temperature above the eutectic temperature of said two layers and said Cd halides, selectively removing said solid solution layer to form a plurality of photoconductor islands, and forming the electrodes connecting to said photoconductor islands.

In said process, instead of first treating the two layers into a solid solution and then selectively removing it to form a plurality of photoconductor islands, the two layers may be previously selectively removed to form a plurality of islands and then they may be subjected to an activating treatment.

In the accompanying drawings:

FIG. 1 is a flow sheet illustrating an embodiment of the method according to this invention.

FIG. 2 is a sectional view of the principal parts of an image sensor produced according to said method.

FIG. 3 is a plane view of FIG. 2.

Now the invention is described in detail by way of an embodiment thereof with reference to the accompanying drawings.

EXAMPLE

Referring to FIG. 1 (A) to (E), reference numeral 1 designates an insulating substrate such as glass, 2 a chemical deposited film of CdS, 3 an evaporated or sputtered film of CdSe or CdTe, 4 a solid solution film of CdS and CdSe or CdTe, and 5 a an array of photoconductor elements obtained by suitable means such as photoetching. The said structure can be produced in the following way. First, a CdS film 2 is fomred uniformly to a thickness of approximately 0.2 to 1.0 $\mu$m on a glass substrate 1 by means of chemical deposition or chemical spraying (FIG. 1 (A) and (B)). The chemical deposition or chemical spray techniques are disclosed in Japanese Patent Publication No. 7376/1968 and U.S. Pat. No. 3,148,084, and according to these methods, there can be obtained a semiconductor film of a compound of normal composition having good adhesiveness to the glass substrate.

On said CdS film 2 is evaporated a film of CdSe or CdTe, which is a sensitizer, while controlling the film thickness. This treatment allows control of the CdS and CdSe or CdTe mixing ratio and obtainment of the desired properties such as spectral sensitivity (FIG. 1 (C)).

The CdS film 2 and CdSe or CdTe film 3 are subjected to a heat treatment with, for example, a small quantity of $CdCl_2$ powder in a half-closed vessel at a temperature above 540° C. which is the eutectic temperature of CdS and $CdCl_2$, thereby forming a solid solution film 4 (FIG. 1 (D)).

The solid solution film is selectively removed by the photoetching techniques to form an array of small photoconductive element films 5 with a size of the order of $100\mu \times 100\mu$ (FIG. 1 (E)). Then the electrodes 6 made of NiCr-Au or the like are formed on both sides of each element by photoetching (FIGS. 2 and 3).

CdSe or CdTe may not necessarily be used but other suitable sensitizing materials such as ZnSe may be employed for the film 3 formed on the CdS film 2 by vacuum evaporation or sputtering.

FIG. 2 is a sectional view of the light receiving portion of an image sensor fabricated according to this invention, and FIG. 3 is a plane view thereof.

In the image sensor shown in FIGS. 2 and 3, when light is applied to the array of photoconductive elements 5, there takes place a change in resistivity thereof, and such change of resistivity is read by a drive circuit connected to the outside of the system.

As described above, the method of this invention is capable of forming an image sensor having a photoconductive film with good adhesiveness to the glass substrate and high sensitivity. It is also possible according to this invention to produce with ease a large-sized image sensor (for example almost equal in size to an original document) which has high sensitivity and is capable of high-speed reading.

If the films 2 and 3 of said two layers are merely heat treated in a gas not containing vapor of Cd halide, for example, in an inert gas, no solid solution is formed unless a long-time heat treatment is conducted at a temperature far higher than the eutectic temperature of said films and Cd halide. In such case, therefore, if the film thickness is small, the component elements may evaporate from the film surface by the time when a solid solution is formed, resulting in a reduced film thickness and non-uniformity of the solid solution composition. Accoridng to the method of this invention where said two layers are subjected to an activating treatment together with Cd halide, a solid solution can be formed at a relatively low temperature and also the acceptor and donor impurities are doped uniformly with growth of crystal, so that there can be obtained a photoconductive solid solution film with high sensitivity and fast photoresponse speed.

What is claimed is:

1. A method of producing a contact type image sensor, which comprises forming a thin CdS film on an insulating substrate by chemical deposition or chemical spray, forming on this film a thin CdSe or CdTe film, subjecting said two layers to an activating heat treatment in an atmosphere containing vapor of at least one of the halides of Cd which is a common flux for said two layers at a temperature above the eutectic temperature of said two layers and said Cd halide, thereby turning said two layers into a solid solution, then selectively removing said solid solution layer to form a plurality of photoconductor islands, and further forming the electrodes connecting to said photoconductor islands.

2. A method of producing a contact type image sensor, which comprises forming a thin CdS film on an insulating substrate by chemical desposition or chemical spray, forming on this film a thin CdSe or CdTe film, selectively removing said two layers to form a plurality of islands and then subjecting same to an activating treatment in an atmosphere containing vapor of at least one halide of Cd which is a common flux for said two layers at a temperature above the eutectic temperature of said two layers and said Cd halide, thereby turning said two layers into a solid solution to form a plurality of photoconductor islands, and further forming the electrodes connecting to said photoconductor islands.

* * * * *